United States Patent
Variyam

(10) Patent No.: US 7,466,259 B2
(45) Date of Patent: Dec. 16, 2008

(54) METHODS AND APPARATUS TO MEASURE A VOLTAGE ON AN INTEGRATED CIRCUIT

(75) Inventor: Pramodchandran N. Variyam, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/589,003

(22) Filed: Oct. 27, 2006

(65) Prior Publication Data

US 2008/0100484 A1    May 1, 2008

(51) Int. Cl.
    *H03M 1/10* (2006.01)
(52) U.S. Cl. .................. 341/165; 341/155; 324/765
(58) Field of Classification Search ............. 341/155, 341/164, 165, 169, 120; 324/765; 327/78
See application file for complete search history.

(56) References Cited

U.S. PATENT DOCUMENTS 4,323,887 A  *  4/1982  Buurma ..................... 341/165
4,908,576 A  *  3/1990  Jackson ..................... 324/754
6,809,541 B2 * 10/2004  Bu et al. .................... 324/765

FOREIGN PATENT DOCUMENTS

JP          60259018 A  * 12/1985

OTHER PUBLICATIONS

Millman, J. Microelectronics Digital and Analog Circuits and Systems; copyright 1979 McGraw-Hill Publishing Inc. ISBN 0-07-042327-X; p. 610.*

* cited by examiner

*Primary Examiner*—Howard Williams
(74) *Attorney, Agent, or Firm*—Ronald O. Neerings; Wade James Brady, III; Frederick J. Telecky, Jr.

(57) ABSTRACT

Methods and apparatus to measure a voltage on an integrated circuit are disclosed. An example method to measure a voltage on an integrated circuit provides a reference signal to a first input of an encoder, provides a signal having a first voltage to a second input of the encoder, varies the reference signal from a second voltage to a third voltage, determines a first time value associated with a change in a state of an output of the encoder during the varying of the reference signal, and measures the first voltage based on the first time value.

29 Claims, 8 Drawing Sheets

|  | MEMORY |
| --- | --- |
| TIME | VOLTAGE |
| 510 | 100 |
| 2254 | 300 |
| 4515 | 500 |
| 6581 | 750 |
| 8808 | 1100 |
| 10300 | 1400 |
|  |  |

INCREASING TIME WITH INCREASING MEMORY ADDRESS ↓

FIG. 7A

| P(6581) | MEMORY | |
| --- | --- | --- |
| TIME | VOLTAGE | NEXT |
| 6581 | 750 | P(8808) |
|  |  |  |
| 10300 | 1400 |  |
|  |  |  |
| 4515 | 500 | P(6581) |
|  |  |  |
| 2254 | 300 | P(4515) |
|  |  |  |
| 510 | 100 | P(2254) |
|  |  |  |
| 8808 | 1100 | P(10300) |

INCREASING MEMORY ADDRESS ↓

FIG. 7B

METHODS AND APPARATUS TO MEASURE A VOLTAGE ON AN INTEGRATED CIRCUIT

FIELD OF THE DISCLOSURE

This disclosure relates generally to integrated circuit testing, and, more particularly, to methods and apparatus to measure a voltage on an integrated circuit.

BACKGROUND

A modern silicon semiconductor integrated circuit (IC) can have millions of component devices such as transistors in a complex arrangement on a single die. This integration has led to advancements in IC fabrication technologies as well advancements in design automation tools.

Semiconductor IC manufacturers employ production electrical testing to validate that their ICs function correctly. With such large numbers of component devices, complex arrangements of the devices, and a multitude of functionalities, it becomes more difficult and problematic for semiconductor IC manufacturers to perform this validation. This has resulted in an escalating cost to the manufacturers to perform production electrical testing.

While the cost to manufacture silicon ICs can be separated into the cost of the silicon, the cost of the package, and the cost of testing, the escalating cost of production electrical testing has become a significant factor in the cost to manufacture.

Manufacturers employ various designs in their ICs to reduce the cost of testing. Typically, these designs are referred to in the industry as design-for-test (DFT), design-for-testability (DFT), or built-in-self-test (BIST). For digital circuits, great strides have been made in the industry with DFT designs. For example, defect oriented testing using a structural test paradigm is well known. With this type of DFT, no direct attempt is made to test the overall functionality. Instead, this type of testing focuses on testing for defects in the low-level building blocks (e.g., logic gates) and their interconnectivity. If such testing determines there is no defect, correct functioning of the entire circuit is assumed.

For analog circuits and mixed-signal circuits (i.e., circuits that use both analog and digital circuitry), circuit performance is sensitive to manufacturing process variations. Variations in the process can degrade the performance of such circuits. Even if low-level building blocks (e.g., transistors) are free from manufacturing defects, the circuit may still have unacceptable performance. Therefore, for analog and mixed-signal circuits, circuit-specific performance test DFTs have been proposed. For example, DFTs for analog-to-digital converters and for phase-locked loops have been proposed. However, these known DFTs are not adaptable to a wide variety of circuits.

To address this problem for analog and mixed-signal circuits, the industry has found some utility in measuring DC (non-time-varying or average) voltages of critical nodes within the circuit. If testing an integrated circuit determines that the critical nodes on an integrated circuit have DC voltages that substantially match those of a known good integrated circuit, correct functioning of the tested integrated circuit is assumed. One method that has been suggested for measuring DC voltages on an integrated circuit is to use a scanning scheme based on the IEEE 1149.4 standard. This scheme allows external equipment to access IC internal nodes through a test bus. The bus uses pins on the IC package to provide the access required and the measurement is made using external equipment. One problem with this method is that the number of nodes that can be accessed and measured at one time is limited by the number of pins used for the test bus and/or by the limitations of external equipment. Scanning allows the pins to access different nodes at different times but this requires more test time, which may result in unacceptably long total test times for an IC.

Another DFT method that has been proposed for measuring DC voltages of critical nodes is to employ an on-chip analog-to-digital converter or encoder (ADC) to convert a critical node DC voltage to a digital value. This tends to speed up the measurement process compared to using external equipment. Precision and accuracy of the ADC are important considerations with this method. A problem with this method is that an ADC can only measure the voltage of one critical node at a time. Thus, switching the ADC input sequentially to all of the critical nodes can lead to an excessive time for circuit testing. Of course, multiple ADCs could be used in parallel, but integrating these ADCs would significantly increase the area of the IC silicon required to accommodate the ADCs and, thus, increase the cost of the silicon.

BRIEF DESCRIPTION OF THE DRAWINGS

FIG. 7A depicts an example data flowchart to organize encoder calibration data information in a memory.

FIG. 7B depicts another example data structure to organize encoder calibration data information in a memory.

DETAILED DESCRIPTION

Measuring the DC voltage of critical nodes in an integrated circuit is a well-known manner of assessing correct functioning of integrated circuits. However, known techniques for measuring voltages on integrated circuits are not always cost effective. The examples described herein include methods and apparatus for calibrating an encoder and for measuring voltages using an encoder based on calibration data. The example methods and apparatus enable accurate and precise DC voltage measurement of many critical nodes using relatively inexpensive circuitry on the integrated circuit.

Figure 1:
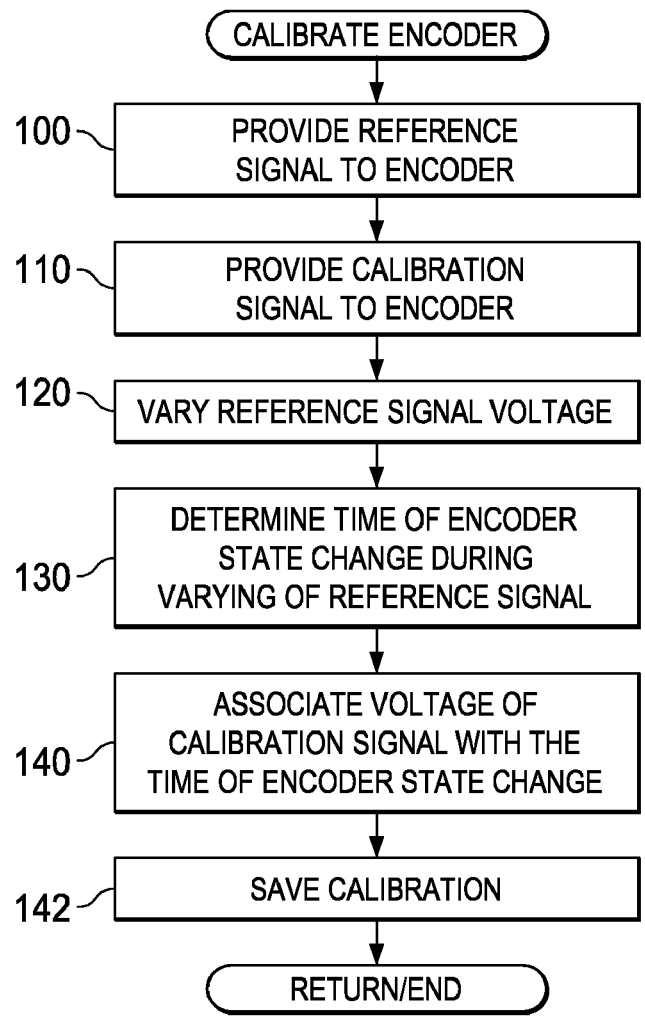
FIG. 1 is a flowchart that illustrates an example method for calibrating an encoder on an integrated circuit.

FIG. 1 is a flowchart illustrating an example method for calibrating an encoder on an integrated circuit. Although the example methods described with reference to the flowcharts in FIGS. 1 and 8, persons of ordinary skill in the art will readily appreciate that the order of execution of the blocks may be changed, and/or some of the blocks described may be changed, eliminated, or combined. Persons skilled in the art will also readily appreciate that the example method illustrated by the flowcharts in FIGS. 1 and 8 may be executed manually, may be executed by dedicated hardware, may be machine readable instructions executed with a computing device, or various combinations of these in a well-known manner. The method of FIG. 1 begins at block 100 where a reference signal is provided to an input of an encoder. While the reference signal is provided, a calibration signal is provided to another input of the encoder (block 110).

Figure 2:
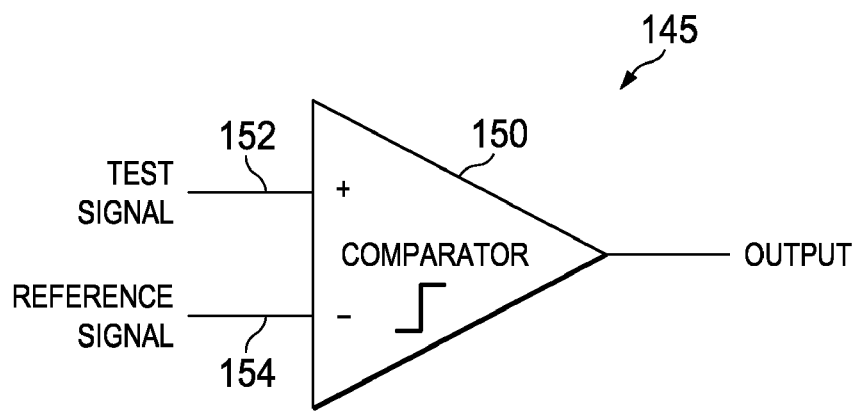
FIG. 2 is a schematic illustration of an example encoder that may be calibrated according to the method of FIG. 1.

To better explain the example method of FIG. 1, consider an example encoder 145 shown in FIG. 2. In the example of FIG. 2, the encoder 145 is implemented using a voltage comparator 150, having an output that is driven to one of two logical states based on the voltage relationship between a non-inverting input 152 and an inverting input 154. In one example of a switching characteristic of the comparator 150, when one of the two inputs 152 and 154 is held at a constant voltage, Vn, and the voltage of the other input is ramped, the comparator 150 switches logic levels at its output to indicate a change of states when the ramp voltage equals Vn or substantially equals Vn. In practice, the switching characteristics of the comparator 150 may deviate in some manners from ideal comparator switching characteristics. As an example, a typical deviation is an offset voltage that changes with Vn. In particular, the comparator 150 may change states when the ramped input is Vn+Voffset, rather than when the ramped input equals Vn.

Calibration using the example method described herein addresses the above-noted and other deviations enabling accurate voltage measurements to be made on integrated circuits using relatively simple and inexpensive encoders. A variety of types of encoders may be used to implement the encoder 145. For example, the encoder 145 may be implemented using a multi-bit ADC that encodes the voltage difference between two inputs into a multi-bit digital code. Other encoders may encode based on both voltage difference and absolute voltage of the inputs. Further, the encoders may have more inputs, more outputs, different encoding behavior, and/or different representations of their states compared to the example comparator 150.

Continuing with the example of FIG. 1 and also referring to the example encoder 145 in FIG. 2, the voltage of the reference signal 154 is varied from a first voltage, at a starting time, to a second voltage at an ending time (block 120). Varying the reference signal 154 in this manner causes the encoder 145 to undergo one or more state changes at its output. Selecting the manner in which the reference signal 154 is varied will be clarified after further explanation of the example method. For simplicity of explanation, unless otherwise noted, the example reference signal 154 can be assumed to be a ramped voltage and the calibration signal can be assumed to be a constant voltage (e.g. DC).

When the encoder 145 undergoes a state change at its output while the reference signal 154 is varied, a first time associated with the state change is determined (block 130). Typically, this involves identifying a logic level change on one or more of the encoder 145 outputs.

Figure 3:
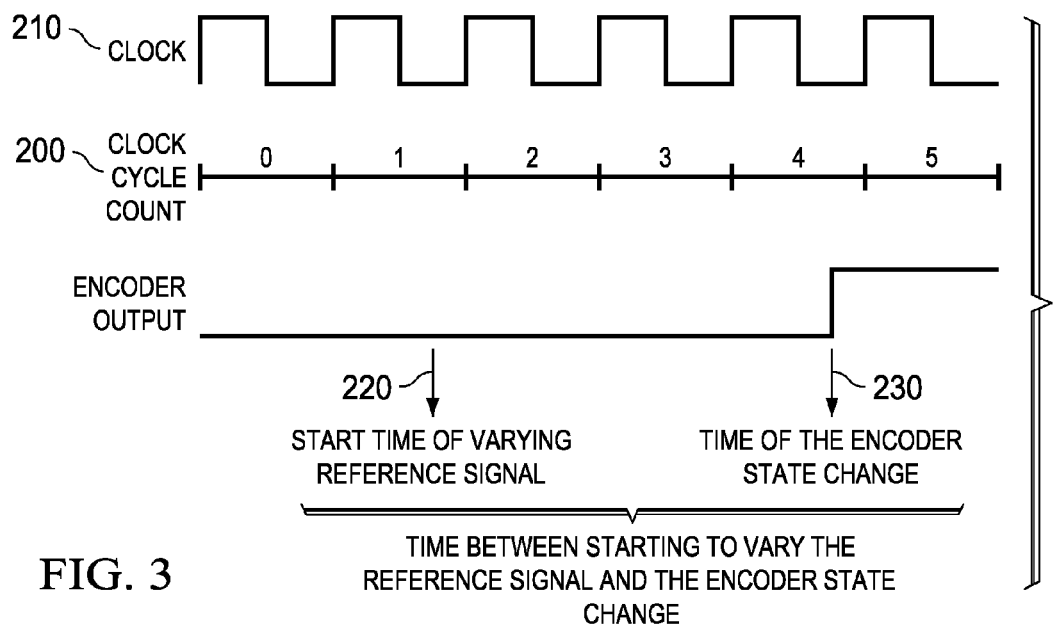
FIG. 3 is a timing diagram depicting an example method for determining a time associated with a state change of an encoder.

An example method for determining the first time associated with an encoder state change (block 130) is depicted in the example timing diagram of FIG. 3. The example of FIG. 3 involves counting the number of cycles 200 of a clock signal 210 that occur between a starting time of varying the reference signal 220 and a time that the encoder changes states 230. With the example timing depicted in FIG. 3, the time between starting to vary the reference signal 220 and the encoder state change 230 is 3.5 clock cycles. There are many ways this counting may be accomplished. One example includes using a counter on the clock signal, capturing the count when the varying of the reference is started, capturing the count again when the encoder changes states, and calculating the difference between the clock cycle count when the encoder state changes and the clock cycle count when the varying of the reference was started. Employing this example technique to the example timing shown in FIG. 3 yields a difference of 4 clock cycles−1 clock cycle=3 clock cycles or 4 clock cycles−1 clock cycles+1=4 clock cycles, depending on the method chosen to handle time differences that are not an exact integer number of clock cycles. For most applications, it may be possible to select a clock with a repetition or clocking rate fast enough so that using only an integer result for the difference in clock cycles produces acceptable accuracy. However, if the use of a sufficiently fast clock is not possible or practical in a particular application, an integer difference method with a fractional clock cycle method, which would measure the fractional part of a clock cycle, may be used instead.

In the illustrated example of FIG. 1, when the first time associated with an encoder state change is determined, a pre-determined voltage of the calibration signal is associated with the first time (block 140). This voltage value and time value pair is saved as calibration data for the encoder (block 142).

In the example method illustrated in FIG. 1, the voltage of the reference signal 154 is varied from a first voltage, at a starting time, to a second voltage at an ending time (block 120). There are many ways in which the voltage of the reference signal 154 may be varied between starting at a first voltage and ending at a second voltage to cause state changes at the output of the encoder 145, thereby making the example method of FIG. 1 very flexible and adaptable.

Figure 4:
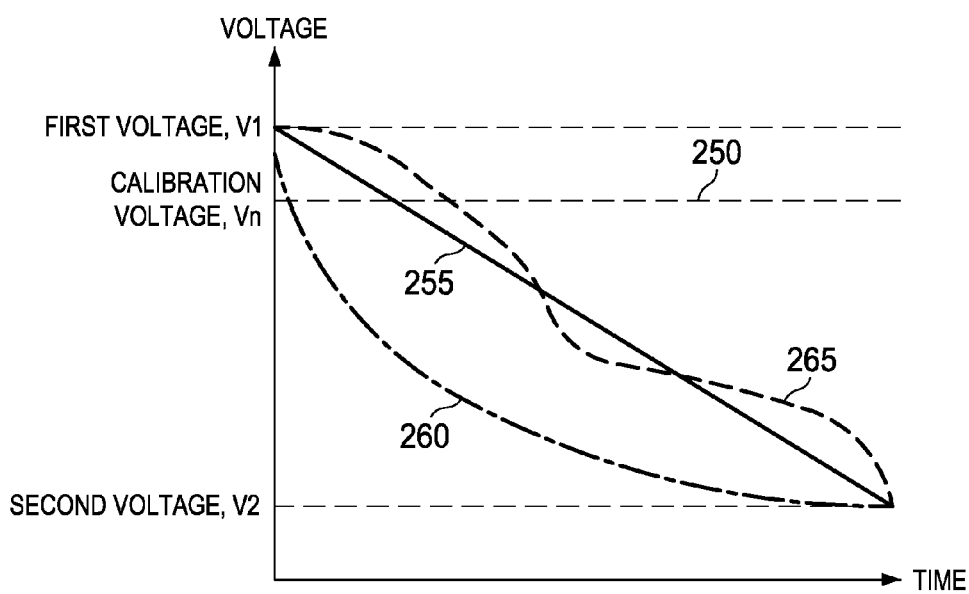
FIG. 4 is a voltage-time graph illustrating three example reference signals that may be used with the example method of FIG. 1.

FIG. 4 is a voltage-time graph illustrating three example reference signals, any of which could be used at block 100 when implementing the example method of FIG. 1. In FIG. 4, the first voltage V1 is shown to be greater than the second voltage V2. However, alternatively, the first voltage V1 may be equal to or less than the second voltage V2. An example reference signal 255 has a voltage that decreases linearly with time. A voltage that changes linearly with time is also referred to as a ramped voltage. Another example reference signal 260 has a voltage that has an exponential-like settling behavior with time. The example of a reference signal having an exponential-like settling or other non-linear characteristic over time may be preferable to a signal having a linear characteristic over time in a case where the encoder is known to be less accurate over a particular input voltage range. Thus, a non-linear input voltage may be used to increase the density of encoder output changes in input voltage ranges associated with lower accuracy to provide relatively more calibration data for these input voltage ranges. A third example reference signal 265 has a complex temporal voltage characteristic. Persons of ordinary skill in the art will readily appreciate that each of the example reference signals 255, 260, and 265 illustrated in FIG. 4 has a complementary form for which the reference signal increases rather than decreases over time.

FIG. 4 also shows an example calibration signal 250 having a substantially constant voltage Vn. Referring also to FIG. 2, if the encoder 145 is implemented using the comparator 150, and the comparator 150 does not deviate substantially from the ideal comparator switching characteristics described above, and one of the reference signal examples 255, 260, or 265 is applied to one input of the comparator 150, and the calibration signal 250, having voltage Vn, is applied to the other input of the comparator 150, the output of the comparator 150 change states at a time at which the reference signal voltage intersects (i.e., equals) the calibration signal voltage Vn. Persons skilled in the art will appreciate that any reference signal will generate state changes in the comparator 150 when the reference signal voltage substantially equals the calibration signal voltage and that the example method could be repeated one or more times using calibration signals having different constant voltages to generate additional calibration data.

Figure 5:
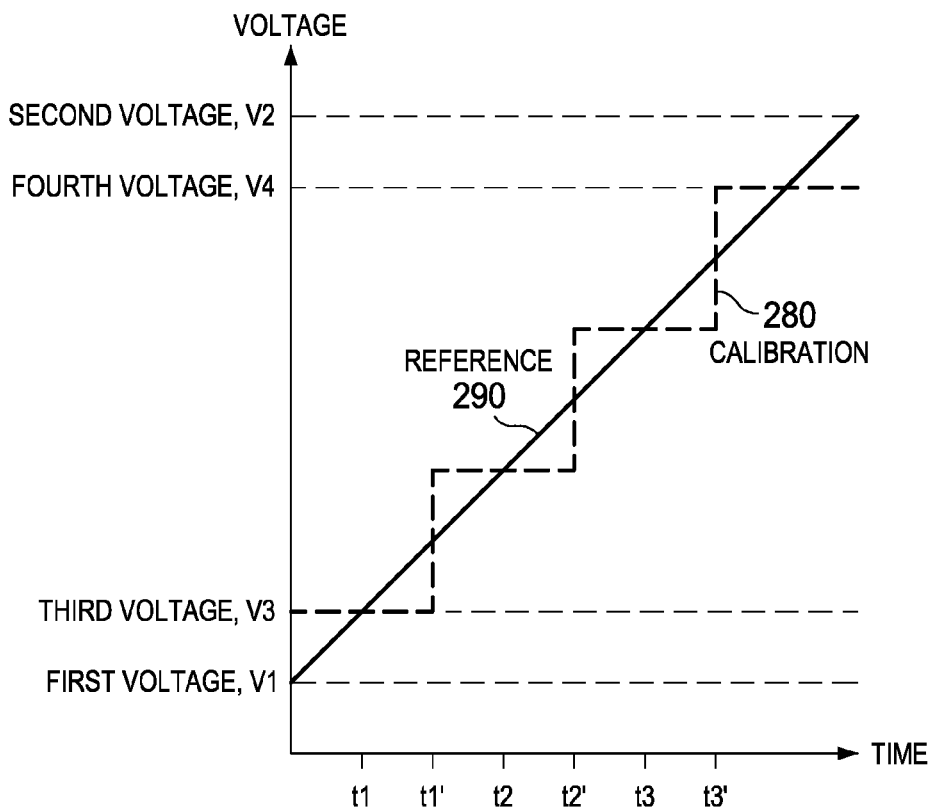
FIG. 5 is a voltage-time graph illustrating an example calibration signal having a stepped voltage and an example reference signal having a linearly increasing voltage that may be used with the example method of FIG. 1.

One example calibration signal has a voltage that varies from one voltage to another. One guide for selecting the reference signal and the calibration signal is to generate state changes in the encoder. Another guide is for these state changes to occur over a range of calibration voltages that encompass the range of voltages the encoder may later be used to measure. The type and behavior of the encoder may also influence the selection. FIG. 5 is a voltage-time graph illustrating an example of a calibration signal 280 having a stepped voltage. It begins at one voltage V3 and ends at another voltage V4. FIG. 5 also shows an example reference signal 290 having a linearly increasing voltage that intersects the stepped voltage calibration signal 280 at several points throughout the voltage range of the stepped calibration signal 280, and that many of these intersections occur when the calibration signal voltage is substantially non-varying, i.e., at the horizontal portions of the stepped calibration signal 280, at points that are not located near the ends of the horizontal portions of the calibration signal voltage. The use of a stepped voltage calibration signal creates local non-time varying steps (i.e., the horizontal portions of the steps) where state changes of the encoder can be caused to occur. An advantage of having an encoder state change during a local non-time varying step of the calibration signal is that the time of the state change is more accurately associated with the calibration voltage because any transient response of the encoder to a varying calibration input will have damped out. The combination of reference signal 290 and calibration signal 280 shown in FIG. 5 is an example of a combination that works well using a simple comparator, e.g., the example comparator (150 in FIG. 2) as an encoder.

The reference signal 290 and the calibration signal 280 shown in FIG. 5 generate comparator output changes at times t1, t2, and t3, as well as comparator output changes at times t1', t2', and t3'. FIG. 5 indicates t1, t2, and t3 to be synchronous with the intersection of the calibration signal 280 and the reference signal 290 in time. In practice, the times may be offset from the intersection time (i.e., the time at which the signals have equal voltages) due to non-ideal comparator switching characteristics (e.g., offset voltage). The times t1, t2, and t3 represent the information needed to calibrate the encoder.

Figure 6:
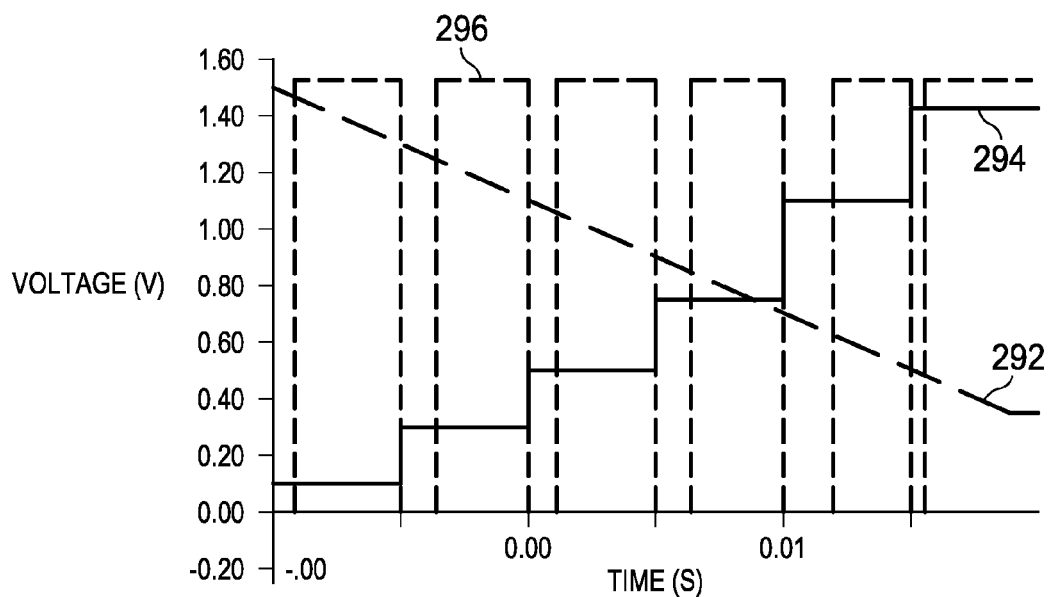
FIG. 6 is a time-voltage graph illustrating an example reference signal and an example calibration signal that may be used with the example method of FIG. 1.

FIG. 6 is a time-voltage graph illustrating an example reference signal 292 and calibration signal 294 that may be used with the example method illustrated in FIG. 1. FIG. 6 also shows an example output 296 of an example encoder. The encoder used in the example is a single-bit inverter that responds to both the difference voltage and the absolute voltages of its two inputs The example calibration method illustrated in FIG. 1 enables a large number of similar encoders on an integrated circuit to be calibrated at the same time using only a single reference signal and a single calibration signal. In other words, the reference signal and the calibration signal may be provided to a relatively large number of encoders at the same time.

FIG. 7A depicts an example method of organizing encoder calibration data information in a memory using a look-up table data structure, which may be used to associate the calibration voltage with the time of the state change state of an encoder. The example look-up table in FIG. 7A has an entry for each calibration data point, where each entry includes a pair of data fields. In one field, data representing the time value of an encoder state change is stored, and in the paired field, data representing the associated calibration voltage value is stored. In the example shown in FIG. 7A, time is represented in clock cycles and voltage in millivolts (mV). In some example implementations, the calibration data is ordered according to the time value field and this variation is depicted in FIG. 7A, where the calibration data information is ordered in the memory according to the time value field.

FIG. 7B is a diagram depicting another example method of organizing encoder calibration data information in a memory using a linked list data structure, which may be used to associate the calibration voltage with the time of the state change of the encoder. The data entries in this example are similar to the look-up table example depicted in FIG. 7A. However, each entry also contains a NEXT field to implement a singly linked list. As will be appreciated by persons of ordinary skill in the art, the look-up table or linked list may be configured in any number of manners and ordering of calibration data may be accomplished using well-known methods.

Figure 8:
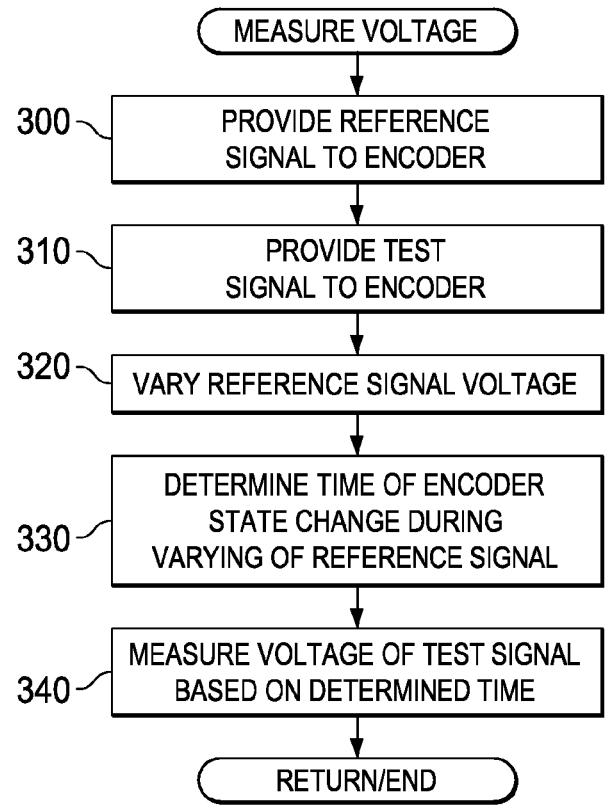
FIG. 8 is a flowchart illustrating an example method for measuring a voltage on an integrated circuit.

FIG. 8 is a flowchart illustrating an example method for measuring a voltage of a signal or node on an integrated circuit. The example method of FIG. 8 begins at block 300 by providing a reference signal to a first input of an encoder. While the reference signal is provided, a signal to measure, referred to as the test signal, having a first voltage is provided to a second input of the encoder (block 310). To better explain the example method, consider the description above of an example where the encoder (e.g., the encoder 145 of FIG. 2) is a comparator (e.g., the comparator 150 of FIG. 2).

Continuing with the example of FIG. 8, and also referring to the example encoder 145 in FIG. 2, the voltage of the reference signal 154 is varied from a second voltage, at a starting time, to a third voltage at an ending time (block 320). Varying the reference signal 154 enables the encoder 145 to undergo one or more state changes at its output. When the encoder 145 undergoes a state change while the reference signal 154 is varied, a first time associated with the state change is determined (block 330). Typically, this involves looking for a logic level change on one or more of the encoder 145 outputs. An example method for determining the first time associated with an encoder state change is depicted and described above in connection with the timing diagram of FIG. 3.

The first voltage of the test signal (e.g., the signal 152 of FIG. 2) may be measured in a number of ways. In the illustrated example, once the first time associated with the state change of the encoder is determined (block 330), the first voltage of the test signal 152 is measured based on the first time (block 340). There are many methods to make the measurement of the first voltage of the test signal 152 based on the first time. For example, using known design characteristics of the encoder 145 and knowing the reference signal 154 voltage at the time of the change of state of the encoder, a measured voltage from the time of the change of state of the encoder can be calculated. In the illustrated example, the first voltage of the test signal 152 is measured using the first time of the change of the state of the encoder 145 and calibration data that was generated using the example method of calibrating an encoder on an integrated circuit illustrated and described above in connection with FIG. 1.

Figure 9:
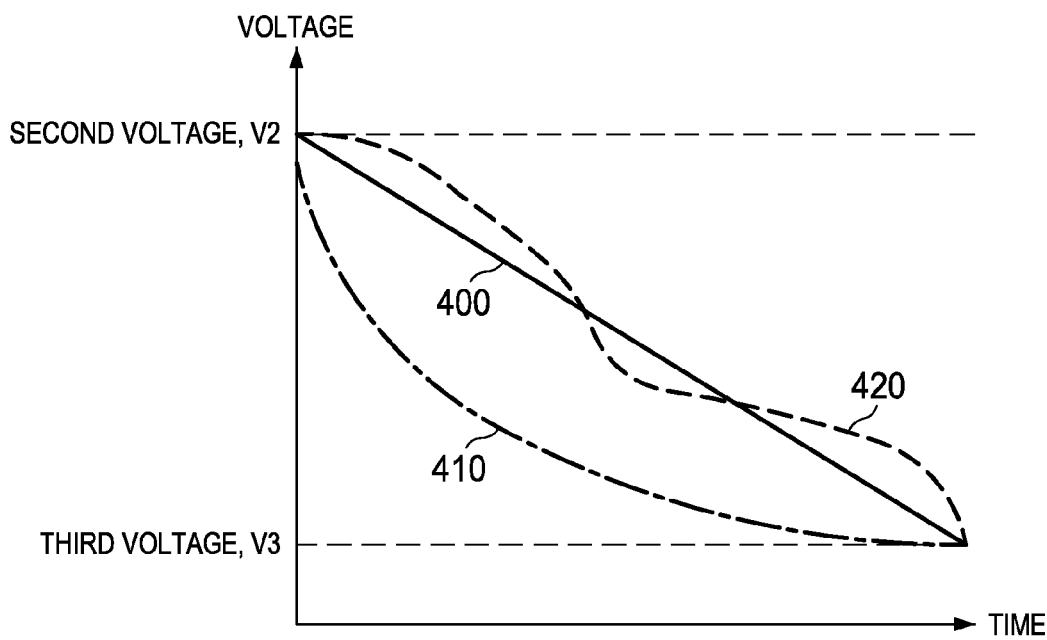
FIG. 9 is a voltage-time graph illustrating three example reference signals that may be used with the example method of FIG. 8.

In the example method illustrated in FIG. 8, the voltage of the reference signal is varied from a second voltage, at a starting time, to a third voltage at an ending time (block 320). There are a number of manners in which the voltage of the reference signal may be varied between starting at the second voltage and ending at the third voltage to cause state changes in the encoder, making the example method very flexible and adaptable. FIG. 9 is a voltage-time graph illustrating three example reference signals. In FIG. 9, the second voltage V2 is shown to be greater than the third voltage V3. However, alternatively, the second voltage V2 may be less than the third voltage V3. An example reference signal 400 has a voltage that decreases linearly with time. A voltage that changes linearly with time is also referred to as a ramped voltage. Another example reference signal 410 has a voltage that has an exponential-like settling behavior with time. The example of a reference signal having an exponential-like settling or other non-linear characteristic over time may be preferable to a signal having a linear characteristic over time in a case where the encoder is known to be less accurate over a particular input voltage range. Thus, a non-linear input voltage may be used to increase the density of encoder output changes in input voltage ranges associated with lower accuracy, to have relatively more calibration data for these ranges. A third example reference signal 420 has a complex temporal voltage characteristic. Persons of ordinary skill in the art will readily appreciate that each of the example reference signals 400, 410, and 420 illustrated in FIG. 9 has a complementary form for which the reference signal increases rather than decreases over time.

Thus, the example method illustrated in FIG. 8 enables a large number of similar encoders on an integrated circuit to be used to measure the voltage of a large number of test signals at the same time using a single reference signal.

Figure 10:
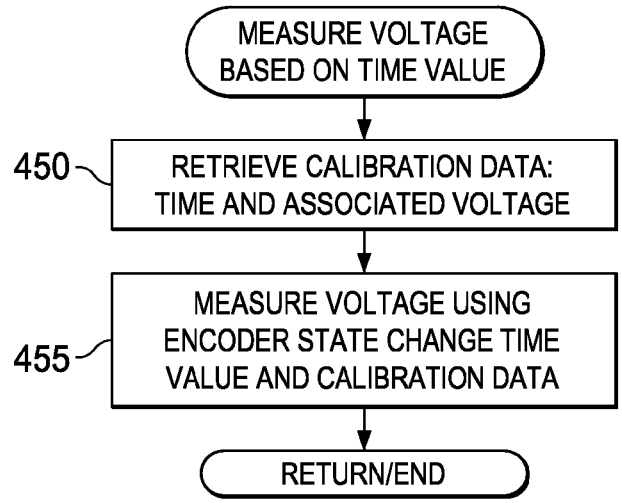
FIG. 10 is a flowchart illustrating an example method for measuring a voltage based on a first time associated with a change of state of an encoder.

An example method for measuring the first voltage based on the first time associated with the change of state of the encoder is illustrated in FIG. 10. The method of FIG. 10 begins at block 450 by retrieving one or more calibration data pairs, where each data pair includes a calibration time value and a calibration voltage value associated with the calibration time value. Calibration data is used along with the first time associated with the change of state of the encoder to measure the first voltage of the test signal (block 455). Calibration data may be retrieved in a number of different manners. For example, all calibration data could be retrieved and then a measuring method employed. Alternatively, a more iterative process may be employed whereby some of the calibration data is retrieved, followed by some part of a measurement method, followed by retrieving more calibration data, followed by more of the measurement method, etc.

In the illustrated example, the calibration data is retrieved from a look-up table in a memory. An example look-up table in a memory is illustrated in FIG. 7A. The look-up table has an entry for each calibration data point, where each entry includes of a pair of data fields. In one field, data representing the time value of an encoder state change is stored and, in the paired field, data representing the associated calibration voltage value is stored. Time values are represented in clock cycles and voltage values are represented in mV. Another example method for retrieving calibration data, illustrated in FIG. 7B, includes retrieving calibration data from a linked list in a memory. The data entries in this example are similar to the look-up table example depicted in FIG. 7A. However, each entry also contains a NEXT field to implement a singly linked list. There are many ways to represent and organize the calibration data. For example, the look-up table or linked list may be configured different manners and ordering of calibration data may be accomplished using well-known methods, or data structures other than a look-up table or linked list may be used. The calibration data may be ordered by voltage values rather than time values, or not ordered at all.

Using the calibration data along with the first time of a change in state of an encoder in measuring the first voltage of the test signal (block 340, FIG. 8) enables imperfect characteristics of the encoder to be corrected. In other words, information about imperfect characteristics of the encoder is captured in the calibration data.

Figure 11A:
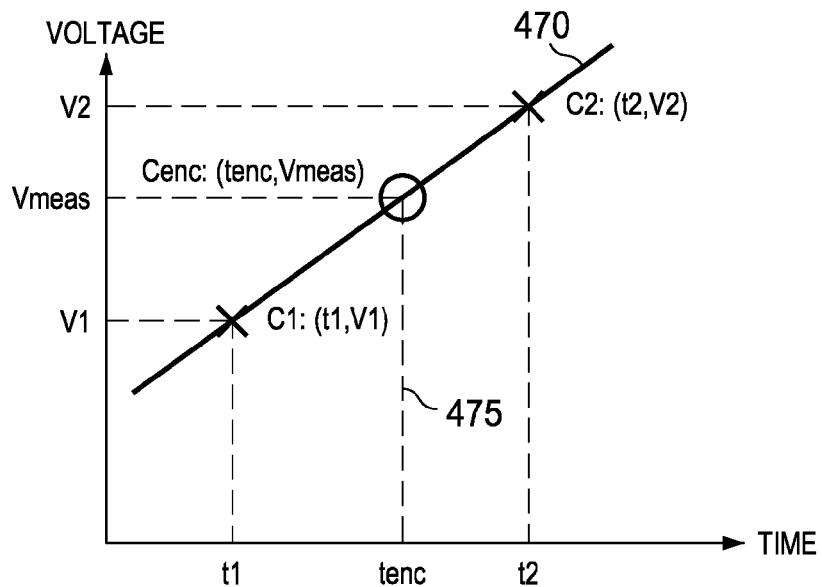
FIG. 11A is a voltage-time graph illustrating an example method employing interpolation to measure the voltage of a test signal.

FIG. 11A is a voltage-time graph illustrating an example method employing interpolation to measure the first voltage of the test signal (block 340 of FIG. 8). In FIG. 11A, C1:(t1, V1) and C2:(t2,V2) represent two example pairs of calibration data. The variables t1 and t2 are calibration time values and V1 and V2 are, respectively, the voltage values associated with the times t1 and t2. Time tenc represents the first time of a state change of the encoder. The first voltage of the test signal is measured by linearly interpolating between C1:(t1, V1) and C2:(t2,V2). This is graphically illustrated by a line (470) through C1:(t1,V1) and C2:(t2,V2) and a point Cenc:(tenc,Vmeas), found where line 470 intersects the vertical line 475 defined by TIME=tenc. The voltage coordinate, Vmeas, of the point Cenc:(tenc,Vmeas) is the resulting voltage measurement of the first voltage of the test signal. The calibration data pairs represented by C1:(t1,V1) and C2:(t2, V2) may be selected from a larger set of calibration data pairs.

To employ linear interpolation, tenc must lie between the time values t1 and t2. In the illustrated example, two calibration data pairs are selected such that their time values are nearest to time tenc among all of the calibrations data pairs and such that one calibration time is less than tenc and the other calibration time is greater than tenc. However, other calibration data pairs may be used for linear interpolation.

Figure 11B:
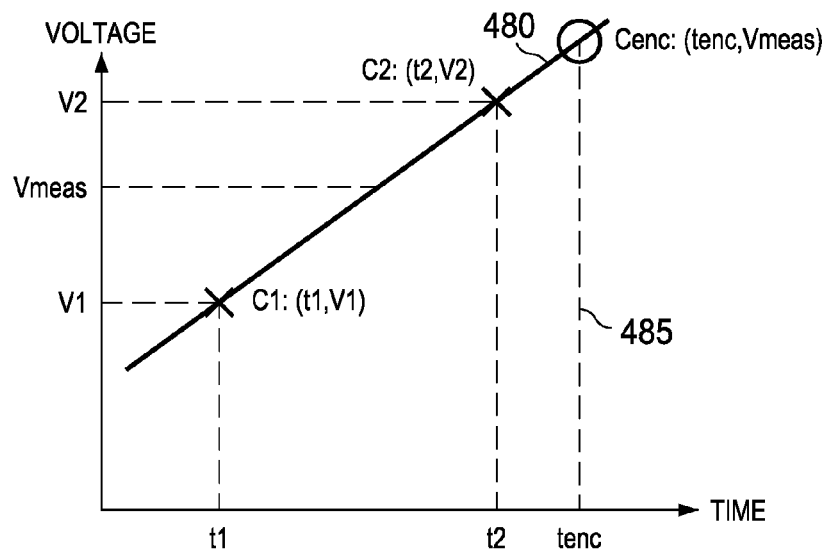
FIG. 11B is a voltage-time graph illustrating an example method employing extrapolation to measure the voltage of a test signal.

FIG. 11B is a voltage-time graph illustrating another example method for measuring the first voltage of the test signal. In FIG. 11B, C1:(t1,V1) and C2:(t2,V2) represent two example pairs of calibration data and time tenc represents the first time of a state change of the encoder. In this example, t1 and t2 are both less than tenc. However, alternatively, t1 and t2 could both be greater than tenc. The first voltage of the test signal is measured by linearly extrapolating beyond C1:(t1, V1) and C2:(t2,V2). This is graphically illustrated by a line (480) through C1:(t1,V1) and C2:(t2,V2) and a point Cenc:(tenc,Vmeas), found where line 480 intersects the vertical line 485 defined by TIME=tenc. The voltage coordinate, Vmeas, of the point Cenc:(tenc,Vmeas) is the resulting voltage measurement of the first voltage of the test signal. The calibration data pairs represented by C1:(t1,V1) and C2:(t2, V2) may be selected from a larger set of calibration data pairs.

In the illustrated example, two calibration data pairs are selected such that their time values are nearest to time tenc among all of the calibrations data pairs and such that both calibration time values are less than tenc or are greater than tenc. However, other calibration data pairs may be used for linear extrapolation.

In the illustrated example of FIG. 8, cubic spline interpolation of the calibration data may be performed using the calibration data. This method is similar to linear interpolation illustrated graphically in FIG. 11A except that instead of the line 470 through C1:(t1,V1) and C2:(t2,V2), a cubic curve through C1:(t1,V1) and C2:(t2,V2) is determined and the point Cenc:(tenc,Vmeas) is determined where the cubic curve intersects the vertical line 475 defined by TIME=tenc. Interpolating, extrapolating, and curve-fitting methods are well known to persons of ordinary skill in the art and such persons will appreciate that any number of these methods may be employed individually or in combination on calibration data to arrive at a measurement of the first voltage and will appreciate that interpolation, extrapolation, or curve-fitting may be applied to a combination of calibration data and other information, e.g., predicted encoder characteristics.

In the illustrated example of FIG. 8, the test signal provided to the encoder has a substantially constant voltage. However, other types of test signals could be measured and the voltage measurement result for a non-constant or varying test signal may depend on the specific reference signal and calibration signal that are used for the measurement.

Figure 12:
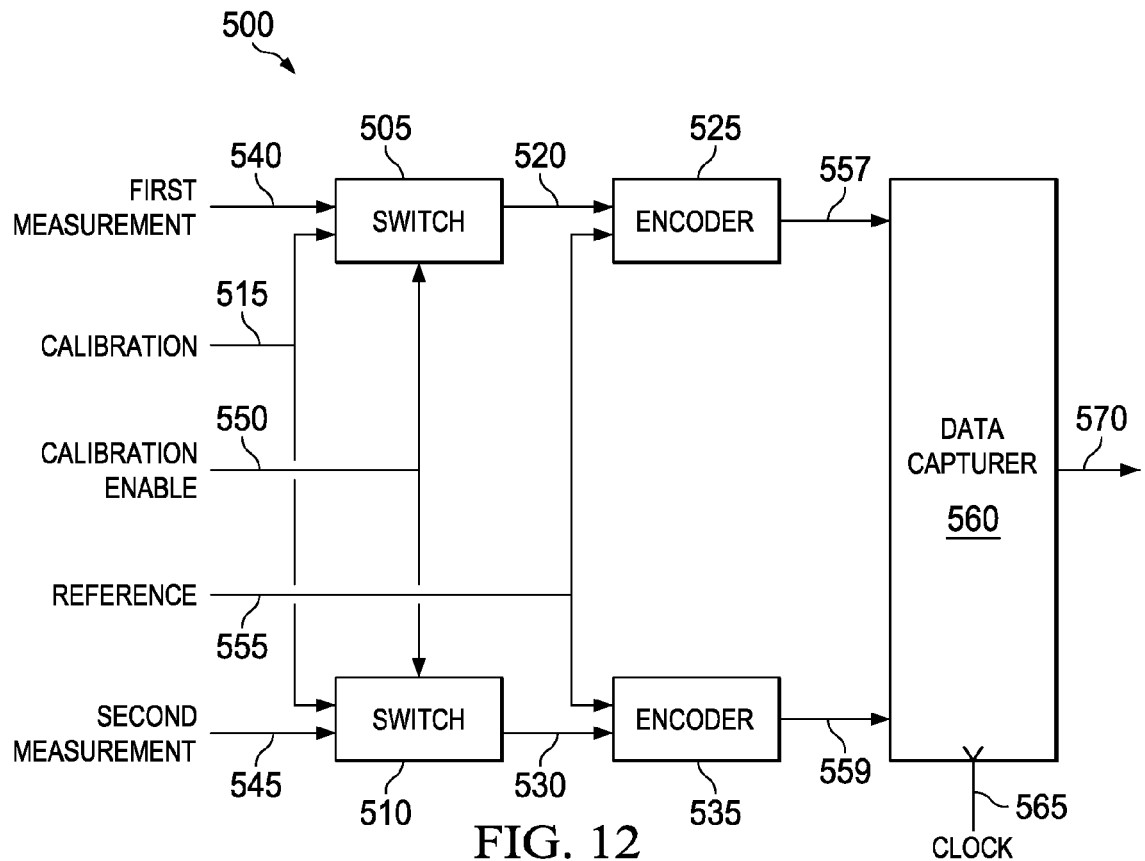
FIG. 12 is a schematic illustration of an example apparatus in an integrated circuit for measuring voltages on the integrated circuit that may be used with the example methods of FIGS. 1 and 8.

FIG. 12 is a schematic illustration of an example apparatus 500 in an integrated circuit for measuring voltages on the integrated circuit. In the example apparatus 500, first and second switches 505 and 510 enable the apparatus 500 to switch modes. One mode is a calibration mode in which the first switch 505 is configured to transmit via its output a calibration input 515 to a first input 520 of a first encoder 525 and the second switch 510 is configured to transmit via its output the calibration input 515 to a second input 530 of a second encoder 535. A second mode is a voltage measurement mode in which the voltage measurement mode, the first switch 505 is configured to transmit via its output a first measurement input 540 to the first input 520 of the first encoder 525 and the second switch 510 is configured to transmit via its output a second measurement input 545 to the second input 530 of the second encoder 535. The configurations of the first and second switches 505 and 510 are controlled by a calibration enable input 550 that is shared by the first and second switches 505 and 510. In the illustrated example, the calibration mode enables calibration of the encoders and the voltage mode enables measurement of the voltages of the nodes on the integrated circuit for production testing of the integrated circuit. The encoders 525 and 535 share a reference input 555. For clarity of explanation, the illustrated example of FIG. 12 shows two encoders. However, the example apparatus may be modified to include any number of additional encoders to enable the simultaneous measurement of any desired number of node voltages on an integrated circuit.

The first and second switches 505 and 510 act as single pole, double throw (SPDT) switches. However, the switches 505 and 510 may be implemented as needed to suit the integrated circuit to be measured. For example, a bipolar transistor based design may be used. In one preferred example, a CMOS SPDT transmission gate is used to implement each of the switches 505 and 510.

Figure 13A:
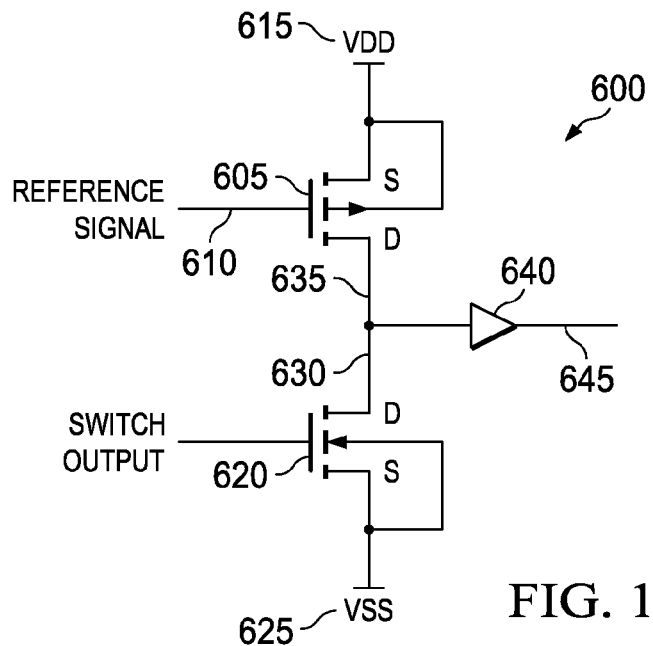
FIG. 13A is a schematic illustration of an example inverter circuit that may be used to implement an encoder of FIG. 12.

FIG. 13A is a schematic illustrating an example inverter circuit 600 that may be used to implement the encoder 525 and/or 535 in FIG. 12. This example inverter circuit 600 includes a first transistor 605 with a first gate coupled to a reference signal 610 and a first source coupled to a first supply voltage 615. A second transistor 620 with a second gate is coupled to a switch output (an output of one of the switches such as, for example, the switches 505 or 510 of FIG. 12). A source of the second transistor 620 is coupled to a second supply voltage 625. A drain 630 of the second transistor 625 is coupled to a drain 635 of the first transistor 605.

Figure 13B:
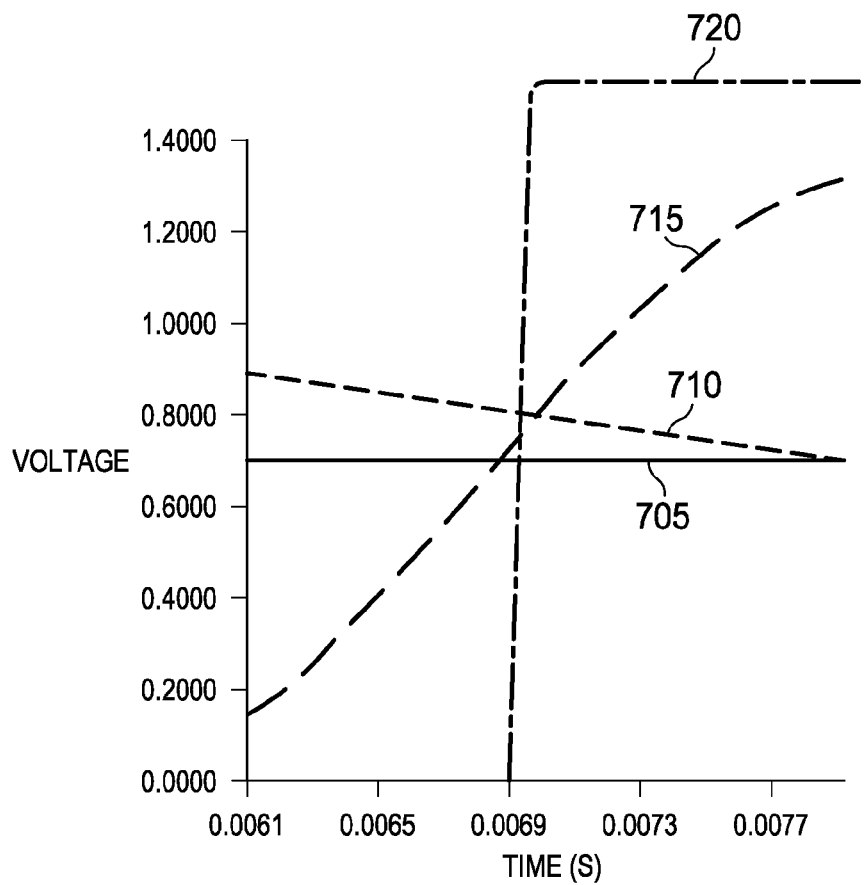
FIG. 13B is a voltage-time graph illustrating example responses of the example inverter circuit of FIG. 13A.

FIG. 13B is a voltage-time graph illustrating an example response of the inverter circuit 600 of FIG. 13A with an output taken at the drain 635 of the first transistor 605. The example response shown in FIG. 13B is for a DC voltage 705 applied to the second gate of the second transistor 620 (FIG. 13A) and a reference signal 610 with a downwardly ramping reference signal voltage 710 applied to the first gate of the first transistor 605. In FIG. 13B, the switching characteristic of the output voltage 715 of the drain output 635 of the example inverter circuit 600 exhibits a voltage offset. Additionally, there is a wide range of the reference signal voltage 710 over which the drain output voltage 715 gradually changes between a low voltage and a high voltage. In other words, the transition of the drain output voltage 715 versus the reference signal voltage 710 is not very similar to the ideal comparator switching characteristics discussed above (e.g., comparator 150 of FIG. 2). The example inverter of FIG. 13A is of a type of inverter known as a current sink inverter. However, other types of inverter circuits may be used instead.

In some applications, the transition of the output voltage 715 versus the reference signal voltage 710 of the inverter circuit 600 of the illustrated example may be too gradual. For example, to capture the specific state of the inverter circuit 600 at the drain 635 of the transistor 605 with a CMOS flip-flop, there is a significant chance of capturing data at a point where the inverter output voltage is outside the logic high and logic low limits of the flip-flop. For such voltages, the time required by the flip-flop to resolve the state depends on the voltage and can be very long. This phenomenon is metastability, which is well known by persons of ordinary skill in the art. In a variation of this example, the inverter circuit 600 includes a buffer 640 with an input of the buffer 640 coupled to the drain 635 of the transistor 605. The output of the inverter circuit is taken at an output 645 of the buffer 640. As shown in FIG. 13B, the buffer output voltage 720 has a significantly sharper voltage transition as compared to the drain output voltage 715. By including the buffer 640, the possibility of capturing an output voltage in the metastability range may be significantly reduced. Additional buffers may be cascaded after buffer 640 to reduce the possibility further.

The reference signal 555 and the calibration signal 515 used in the example apparatus 500 illustrated in FIG. 12 are depicted in the voltage-time diagram of FIG. 6 as 292 and 294, respectively. As discussed above, other types of reference signals and calibration signals may be used instead. FIG. 6 also shows an example output voltage 296 of one of two outputs 557 and 559 of the encoders 525 and 535.

External test equipment may be used in combination with circuitry on the integrated circuit to perform voltage measurements. In the illustrated example of FIG. 12, programmable external test equipment may be used to provide the reference signal 555, the calibration signal 515, and the calibration enable signal 550. In addition, the external test equipment may be used to determine the times of the state changes of the outputs 557 and 559 of the encoders 525 and 535. To keep the on-chip circuitry synchronized with the external equipment and to provide data in an acceptable format for the external equipment in the illustrated example, the states of the outputs 557 and 559 of the encoders 525 and 535 may be captured at specific times based on a clock signal 565 shared by the integrated circuit and the external equipment.

The example apparatus 500 further includes a data capturer 560. The data capturer 560 includes two inputs to receive the two outputs 557 and 559 of the encoders 525 and 535 and, based on the clock signal 565 provided to a clock input of the data capturer 560, the data capturer 560 captures the states of the outputs 557 and 559 of the encoders 525 and 535. In the illustrated example, the states of the outputs 557 and 559 of the encoders 525 and 535 are captured at the beginning of every clock cycle and multiplexed onto an output signal 570. The output signal 570 may be made available to the external test equipment. Persons of ordinary skill in the art will appreciate that some applications will not require a data capturer, that a data capturer may capture data using other timing arrangements, and that a data capturer may multiplex the captured data differently or not at all. For example, the states of the outputs 557 and 559 of the encoders 525 and 535 may be captured at the beginning of every tenth clock cycle or, alternately, the state of the output 557 may be captured at the end of one clock cycle and the state of the output 559 may be captured at the end of the next clock cycle.

Although certain example methods, apparatus, and circuits have been described herein, the scope of coverage of this patent is not limited thereto. On the contrary, this patent covers all apparatus fairly falling within the scope of the appended claims either literally or under the doctrine of equivalents.

What is claimed is:

1. A method of generating calibration data for an encoder on an integrated circuit, comprising:
    providing a reference signal to a first input of the encoder;
    providing a calibration signal to a second input of the encoder;
    varying the reference signal from a first voltage to a second voltage;
    determining a first time value associated with a change in a state of an output of the encoder during the varying of the reference signal, wherein the first time value is determined without reference to another encoder; and
    associating a voltage of the calibration signal with the first time value to generate calibration data for the encoder.

2. A method as defined in claim 1, wherein varying the reference signal from the first voltage to the second voltage comprises increasing or decreasing the voltage from the first voltage to the second voltage.

3. A method as defined in claim 1, wherein increasing or decreasing the voltage from the first voltage to the second voltage comprises linearly increasing or linearly decreasing the voltage from the first voltage to the second voltage.

4. A method as defined in claim 1, wherein providing the calibration signal comprises providing a calibration signal having a substantially constant voltage.

5. A method as defined in claim 1, wherein providing the calibration signal comprises varying the calibration signal from a third voltage to a fourth voltage.

6. A method as defined in claim 5, wherein varying the calibration signal from a third voltage to a fourth voltage comprises providing a stepped voltage signal.

7. A method as defined in claim 1, wherein determining the first time value associated with the change in the state of the output of the encoder comprises counting a number of clock cycles between a second time that the varying of the reference signal was started and a third time associated with the change in the state of the output of the encoder.

8. A method as defined in claim 1, wherein associating the voltage of the calibration signal with the first time value to calibrate the encoder comprises storing information representative of the first time value and the voltage of the calibration signal in a memory.

9. A method as defined in claim 8, wherein storing the information representative of the first time value and the voltage of the calibration signal in the memory comprises storing the information in a data structure.

10. A method as defined in claim 9, wherein storing the information in the data structure comprises storing the information in a look-up table.

11. A method as defined in claim 9, wherein storing the information in the data structure comprises storing the information in a linked-list.

12. A method as defined in claim 1, further comprising:
    providing the reference signal to a third input of a second encoder;
    providing the calibration signal to a fourth input of the second encoder;
    determining a second time value associated with a change in a state of an output of the second encoder during the varying of the reference signal; and
    associating a third voltage of the calibration signal with the second time value to generate calibration data for the second encoder.

13. A method of measuring a voltage on an integrated circuit, comprising:
    providing a reference signal to a first input of an encoder;
    providing a signal having a first voltage to a second input of the encoder;
    varying the reference signal from a second voltage to a third voltage;
    determining a first time value associated with a change in a state of an output of the encoder during the varying of the reference signal; and
    measuring the first voltage based on the first time value by using the first time value to retrieve a calibration voltage value stored in association with a calibration time value prior to measuring the first voltage, and using the calibration voltage value to compute a measured voltage corresponding to the first voltage.

14. A method as defined in claim 13, wherein determining the first time value associated with the change in the state of the output of the encoder comprises counting a number of clock cycles between a second time that the varying of the reference signal was started and a third time associated with the change in the state of the output of the encoder.

15. A method as defined in claim 13, wherein computing the measured voltage comprises interpolating, extrapolating, or curve fitting.

16. A method as defined in claim 15, wherein interpolating comprises employing linear interpolation or cubic spline interpolation between the calibration voltage value and at least another voltage.

17. A method as defined in claim 13, wherein retrieving the calibration time value and the calibration voltage value associated with the calibration time value comprises retrieving information representative of the calibration voltage value associated with the calibration time value from a memory.

18. A method as defined in claim 17, wherein retrieving the information representative of the calibration voltage value associated with the calibration time value from the memory comprises retrieving the information from a look-up table or a linked list.

19. A method as defined in claim 13, wherein varying the reference signal from the second voltage to the third voltage comprises varying the reference signal in a substantially similar manner to a manner a reference signal was varied during a calibration of the encoder.

20. A method as defined in claim 13, wherein providing the signal having the first voltage to the second input of the encoder comprises providing a substantially constant voltage to the second input of the encoder.

21. A method as defined in claim 13 further comprising:
providing the reference signal to a third input of a second encoder;
providing a second signal having a fourth voltage to a fourth input of the second encoder;
determining a second time value associated with a change in a state of an output of the second encoder during the varying of the reference signal; and
measuring the fourth voltage based on the second time value.

22. An apparatus in an integrated circuit for measuring voltages on the integrated circuit, the apparatus comprising
a first switch to transmit a first measurement input or a calibration input to a first output of the first switch based on a calibration enable input;
a second switch to transmit a second measurement input or the calibration input to a second output of the second switch based on the calibration enable input;
a first encoder having a first input coupled to the first output of the first switch, a reference input, and a first output;
a second encoder having a second input coupled to the second output of the second switch, the reference input, and a second output and;
a data capturer to capture state changes of the outputs of the first and second encoders at predetermined portions of a clock input.

23. The apparatus of claim 22, wherein at least one of the first encoder or second encoder comprises an inverter circuit.

24. The apparatus of claim 22, wherein at least one of the first switch or the second switch is a single pole double throw switch.

25. The apparatus of claim 22, wherein the data capturer comprises:
a first input coupled to the first output of the first encoder;
a second input coupled to the second output of the second encoder; and
a means to capture a first state value of the first output of the first encoder and a second state value of the second output of the second encoder based on the clock input.

26. The apparatus of claim 25 wherein the means to capture the first state value of the first output of the first encoder and the second state value of the second output of the second encoder based on the clock input is to capture the first state value of the first output of the first encoder at a first time based on the clock input and to capture the second state value of the second output of the second encoder at a second time based on the clock input.

27. The apparatus of claim 25 wherein the means to capture the first state value of the first output of the first encoder and the second state value of the second output of the second encoder based on the clock input is to capture the first state value of the first output of the first encoder and the second state value of the second output of the second encoder at a first time based on the clock input.

28. An apparatus is an integrated circuit for measuring voltages on the integrated circuit, the apparatus comprising:
a first switch to transmit a first measurement input or a calibration input to a first output of the first switch based on a calibration enable input;
a second switch to transmit a second measurement input or the calibration input to a second output of the second switch based on the calibration enable input;
a first encoder having a first input coupled to the first output of the first switch, a reference input, and a first output; and
a second encoder having a second input coupled to the second output of the second switch, the reference input, and a second output, wherein at least one of the first encoder or second encoder comprises an inverter circuit, and wherein at least one inverter circuit comprises:
a first transistor comprising a gate coupled to the reference input and a source coupled to a first voltage supply; and
a second transistor comprising a gate coupled to the first output of the first switch, a source coupled to a second voltage supply, and a drain coupled to a drain of the first transistor.

29. The apparatus of claim 28, wherein at least one inverter circuit further comprises a buffer gate with an input coupled to the drain of the second transistor.

\* \* \* \* \*